United States Patent [19]

Tchon

[11] 3,980,902
[45] Sept. 14, 1976

[54] CHARGE INJECTORS FOR CCD REGISTERS

[75] Inventor: Wallace E. Tchon, Phoenix, Ariz.

[73] Assignee: Honeywell Information Systems, Inc., Phoenix, Ariz.

[22] Filed: June 30, 1975

[21] Appl. No.: 592,147

[52] U.S. Cl. .............................. 307/304; 307/221 C; 307/221 D; 357/24
[51] Int. Cl.² .................. H03K 3/353; H01L 29/78
[58] Field of Search ............ 307/221 C, 221 D, 304; 357/24

[56] References Cited
UNITED STATES PATENTS

| | | | |
|---|---|---|---|
| 3,760,202 | 9/1973 | Kosonocky | 307/304 |
| 3,891,977 | 6/1975 | Amelio et al. | 357/24 |

OTHER PUBLICATIONS

"Staggered Oxide C⁴D Structure with Clocked Source Repeater" by Tchon et al.; IEDM, 1973, pp. 27–28.

*Primary Examiner*—Stanley D. Miller, Jr.
*Attorney, Agent, or Firm*—William W. Holloway, Jr.

[57] ABSTRACT

A device for injecting precisely controlled amounts of charge corresponding to data bits, into charge-coupled device registers. The device converts input signals in the form of logic level voltages into relatively small packets of charge. The device allows for relatively large variations at its input terminal, yet still produces highly controlled levels of charge at its output terminal. The output level of charge is also highly controlled despite variations in process parameters for a semiconductor wafer.

22 Claims, 13 Drawing Figures

CHARGE INJECTORS FOR CCD REGISTERS

RELATED APPLICATIONS

No. 1. "Multi-Phase Series-Parallel-Series Charge Coupled Device Registers" invented by Ben R. Elmer et al., Ser. No. 592,156, filed on June 30, 1975.

No. 2. "Multi-Phase Series-Parallel-Series Charge-Coupled Device Registers With Simplified Input Clocking" invented by Ben R. Elmer et al., Ser. No. 591,724, filed on June 30, 1975.

No. 3. "Charge Detectors For CCD Registers" invented by Ben R. Elmer and Wallace E. Tchon, Ser. No. 591,667, filed on June 30, 1975.

No. 4. "CCD Register Interface With Partial-Write Mode", invented by Ben R. Elmer and Wallace E. Tchon, Ser. No. 591,723, filed on June 30, 1975.

No. 5. "Chain Selection Scheme in a Fault-Tolerant Mode and Circuits for Implementing Same", invented by Ben R. Elmer, Serial No. 592,155, filed on June 30, 1975.

No. 6. "Fault-Tolerant CCD Memory Chip", invented by Ben R. Elmer, et al., Ser. No. 591,666, filed on June 30, 1975.

No. 7. "Staggered Oxide Conductivity Connected Charge-Coupled Device", invented by Wallace E. Tchon, Ser. No. 475,370, filed on June 3, 1974.

BACKGROUND OF THE INVENTION

1. Field of the Invention

The invention relates generally to charge-coupled devices and in particular to a device for injecting a highly controlled level of charge into a charge-coupled device (CCD) register.

2. Description of the Prior Art

Charge-coupled devices (CCDs) comprise a relatively new technology for storage and transfer of information. They operate so as to store packets of charge in sites or cells within the CCDs. The transfer of charge from one cell to another may be done only in a serial manner. CCDs may allow for significant cost reductions in mass storage systems, if high densities are realized. However, their application is available only when serial storage systems are utilizable.

Charge-coupled devices comprises near conservative systems (some charge may be lost to substrate or ground by leakage), that is, charge is not and cannot be generated within the device. Charge is injected into a CCD at its input terminal and thereafter may be stored or transferred within or through the device. During storage and transferring stages, charge is dispersed.

To achieve desired economies, CCDs must be of very high density. This requires, in part, that each site within the CCD is relatively small. Small cites can hold only small amounts of charge. However, (differential) charge amplifiers used to sense charge emitted from CCD storage registers require good 1 and 0 definition to properly operate. Accordingly, it is of prime importance to have a system for injecting charge into a CCD which is capable of controlling the levels of injected charge in a highly precise manner, that is, the tolerance for levels of injected charge is extremely narrow.

The charge injector must act as a buffer between system level voltages and CCD charge levels. In effect, it is a converter from these relatively high voltage levels corresponding to logic levels at its input and the CCD levels at its output. Input levels may be in the order of 10 or 12 volts whereas output levels are on the order of approximately 50 to 230 Femto Coulombs. Furthermore, the system level voltages may have wide variation. Therefore, the device must be relatively insensitive at its input while still having higly controlled output charge levels.

In order to inject levels of charge into a CCD, it is theoretically possible to attach a current source as the input to the CCD, and gate this current source so as to control the amount of charge sent to the CCD. In this manner, current would flow into the device, filling up (or injecting) charge to a predetermined level. Unfortunately, this approach is strictly theoretical in nature and is not applicable for the required function. This is because a current source of an extremely precise magnitude would be required and would have to be gated in such a highly-controlled fashion. Such degrees of precision exceed realistic tolerance levels of known current sources.

Another method of injecting charge into a CCD is by attaching a fixed voltage to the device, and by regulating an electrode acting as a gate coupling the voltage to the device. An example of this method is given in a patent entitled, "Input Circuits for Charge Coupled Circuits", invented by Kosonocky, U.S. Pat. No. 3,760,202, issued Sept. 18, 1973. However, methods such as those taught by Kosonocky are only applicable where relatively large cells are utilized and can tolerate larger amounts of uncertainty in the injected signals than would be applicable for the present invention. The method utilized by Kosonocky is generally referred to as the "fixed voltage technique" and has been utilized by others in the prior art. In the fixed voltage method, a fixed reference voltage is connected to the first cell of the CCD via an input control gate. By applying appropriate clock pulses to the input control gate, charge is transferred into the first cell site. However, the amount of charge which is transferred into the cell site is dependent on the level of the reference voltage. Unfortunately, the reference voltage cannot be regulated with the precision required for this application. Furthermore, the input control gate also stores charge in the region of its electrode. The amount of charge underneath this gate may vary and its flow may be unregulated and uncertain. Depending upon the size of the input control gate with respect to cell size, this may present a problem in its utilization. In a system requiring very high density, as required for CCD applications, the control gate must be small, generally, approximately the size of a typical cell site. A control gate of this magnitude may not be gated with the desired precision. Furthermore, it holds charge of levels which may effect the amount of charge transferred into the first cell site. Accordingly, other methods of charge injection are required for the present invention and purposes.

It has been suggested to utilize a clocked source method of charge injection for CCDs. This method provides for a variable (clocked) voltage to be connected to the first cells of the register via an input control gate. This concept was suggested in an article entitled, "Staggered Oxide C4D Structure With Clocked Source Repeater", by W. E. Tchon and J. S. T. Huang, December, 1973, IEDM, Washington, D.C.

OBJECTS OF THE INVENTION

It is an object of the present invention therefore to provide an improved device for injecting charge into CCD registers.

It is another object of the present invention to provide a device for injecting relatively small levels of charge into CCD registers in a highly-controlled manner.

It is another object of the present invention to provide a charge injector utilizing the clocked source method of operation.

It is another object of the present invention to provide a charge injector which utilizes a forward blocking gate coupled to the clocked source.

It is another object of the present invention to provide a device for injecting charge in the order of magnitude of 50 to 230 FemtoCoulombs into CCD registers.

It is a further object of the present invention to provide a device for injecting into CCD registers which utilize available system voltage and closed sources, thereby providing higher density in the CCD system.

Other objects and benefits of the present invention will become apparent when read in conjunction with the drawings contained herein.

SUMMARY OF THE INVENTION

A clocked source method of charge injection is utilized by the device. The clocked source and control sites are tied to available system clocks. In this manner, high density within the system is possible.

The clocked source is tied to a P++ regions in a substrate. These regions are connected to a forward blocking gate of the first cell of the CCD serial input register via two parallel control paths. By controlling the relative voltages applied as the clocked source and to the electrodes of the sites within the control paths, dependence upon the precise voltage applied as the clocked source is eliminated.

For the first cell of a register to receive a packet of charge, it must be empty and the control sites must be precharged to an appropriate level. A forward blocking gate prevents flow of charge into the first cell. The electrodes of the precharge sites are then turned off, which corresponds to a high level somewhat above the barrier level and charge packets may flow into the first cell. As the voltage applied to the first cell goes high, the charge packet is transferred into the second cell. The clocked source, which is tied to the forward blocking gate simultaneously goes high after the control site goes low, and the control site is precharged. This may be of an amount over a proper charge level. However, the forward blocking gate acts as a barrier, preventing an overflow of charge into the first cell. As the clocked source goes low, excess charge is drained from the control site, and the cycle may be repeated.

DESCRIPTION OF THE PREFERRED EMBODIMENT

Figure 1:
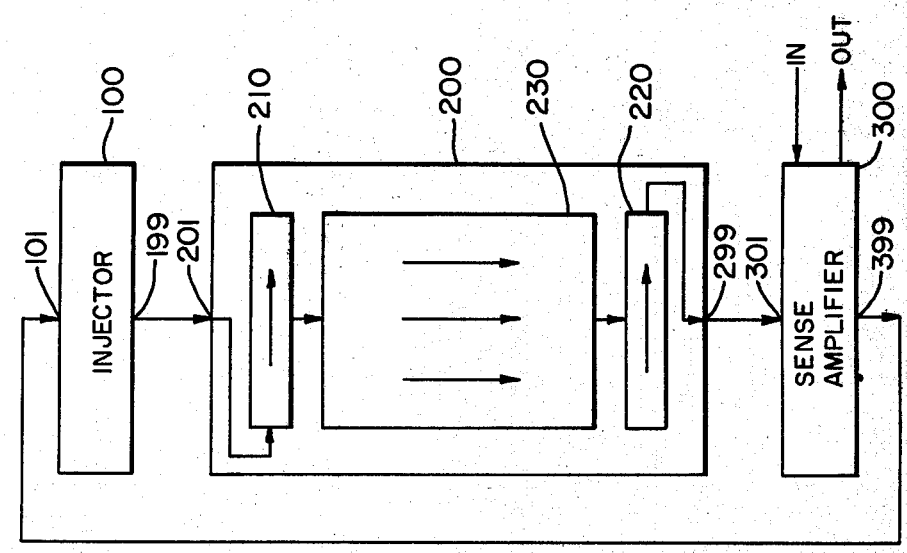
FIG. 1 is a block diagram of an SPS CCD register with an associated injector and sense amplifier.

Referring now to FIG. 1, a block diagram of a CCD register storage system is shown. All of the components in the CCD register storage system are integrated within a single semiconductor chip which may contain a plurality of such register systems. (For additional details, see Related Application No. 6). It is noted that a single line connecting various blocks within FIG. 1 may represent a plurality of connecting leads. Also, the unconnected arrowheads in FIG. 1 represent direction of flow of information bits. The basic element of FIG. 1 is block 200 which represents an SPS register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. CCD sites (or cells) comprising section 210 are also connected to central section 230. Section 210 is coupled to section 230 via a row of gates which allows parallel transfer of information into central section 230. Information bits are then propagated through the lengthwise section of central section 230. In the preferred embodiment, central section 230 is eight bits wide by 32 effective-bits long, thereby providing a 256-bit shift register. The arrows inside of section 230 represent the parallel propagation of information through section 230. At the other (output) end of section 230, the information bits in the form of charge packets are transferred into output serial section 220. Upon receiving the information bits, output section 220 transfers the bits serially to the output section output terminal, which is effectively the output terminal 299 of SPS register 220.

SPS register 220 receives, transfers, and transmits information in the form of small packets of charge, in the order of 50 to 230 $\times$ $10^{-15}$ Coulombs (or smaller). Clearly, these charges are not of a level equivalent to logic signals at a system level. Accordingly, the register must be buffered in order to handle and transmit appropriate input and output signals. The present invention is directed to buffering and conversion problems.

The packets of charge emitted from SPS register 200 must be sensed and amplified, i.e. refreshed, before further propagation. Additionally, they must be converted to appropriate logic levels before they can be bused to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shift register 200. It is also desirable to periodically perform a conventional refresh of the information bits stored in the register 200. This is performed by simply serially shifting the packets of charge from the register to the amplifier, and reinjecting them after they have been amplified. This operation is identical to a read operation with the exception that the latter also entails busing the information, at a logic level, to other system components. Such output busing is done over output line OUT shown in FIG. 1.

Input busing may be done via line IN to amplifier 300. Accordingly, in this CCD storage system, amplifier 300 is considered to include interface circuitry responsive to control signals for directing the flow of information through the system to perform REFRESH, READ and WRITE operations. (For detailed description of such interface circuitry which may be used within sense amplifier 300, see Related Application No. 4.)

An output terminal 399 of amplifier 300 is connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of multiphase SPS registers, see Related Application Nos. 1 and 2.)

Figure 2:
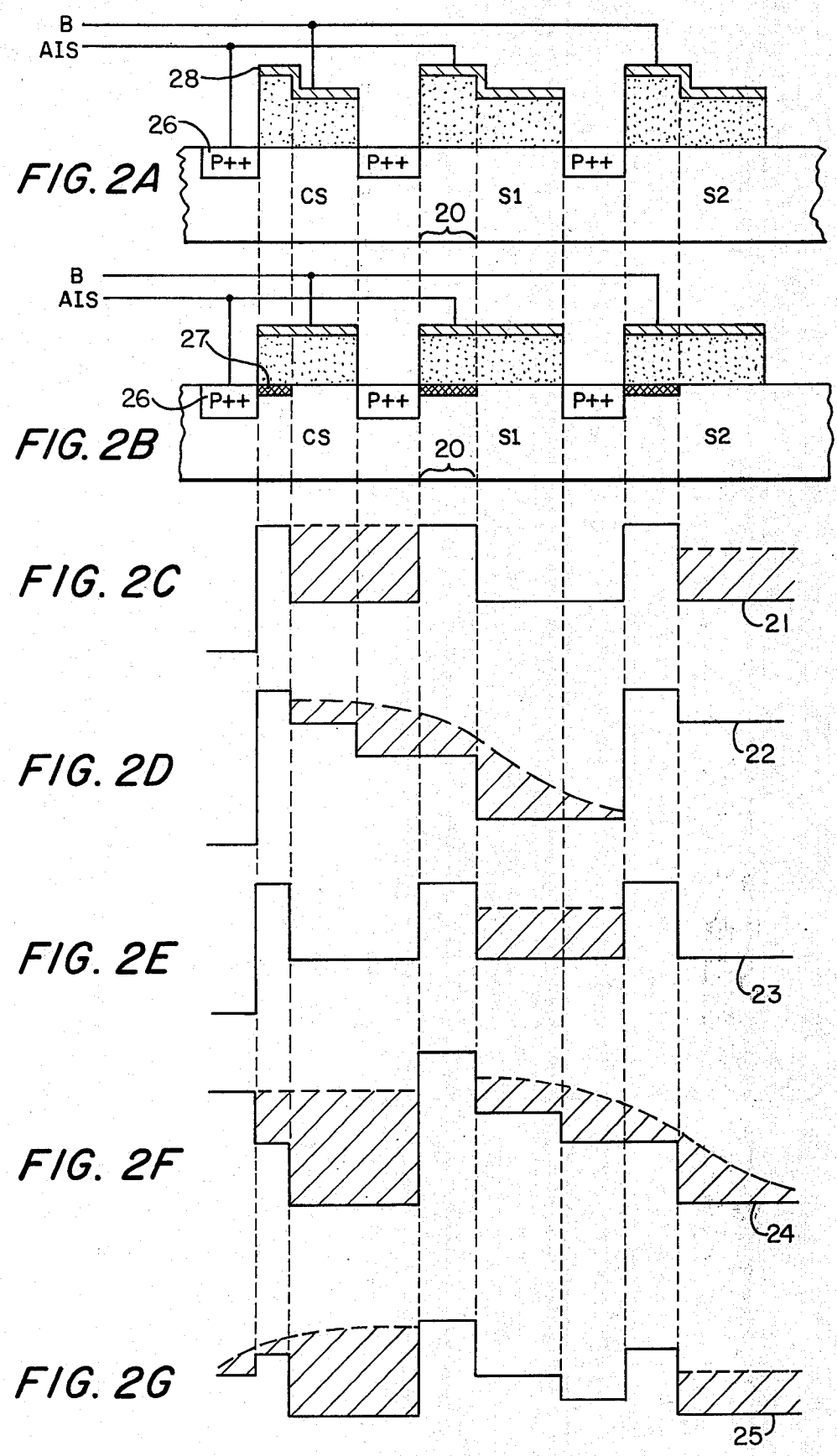
FIGS. 2A and 2B show side views of the input regions of two embodiments of conductivity connected CCD registers and part of an associated injector.
FIGS. 2C–2G are graphs representing potential levels beneath the input regions shown in FIGS. 2A and 2B for different time phases according to the clocked source method of charge injection.

Referring now to FIGS. 2A and 2B, side views of a substrate containing the first two cells in the SPS register and (part of) the injector according to the invention are shown. FIG. 2A shows a staggered oxide CCD; FIG. 2B shows an ion implanted CCD. These two embodiments are functionally equivalent. Phase AIS and phase B of the injector may be the same phase drivers used in the SPS register, thereby requiring fewer clocks in the system and higher density. Cell S1 and cell S2 are the first two cells of serial input register 210. Each of these cells has a barrier in its forward region, which results from the staggered (thicker) oxide layer in FIG. 1A and the ion implantation of FIG. 2B. (Alternate means of providing barriers are also possible.) Successive cells are conductivity connected diffusion regions. (For additional description for such conductivity connected CCDs, refer to Related Application No. 7.) Also shown within the N-type substrate is a P++ region 26 connected to the clocked source, which in the present invention is phase driver AIS. Connecting this P++ clocked source region 26 and an input area 20 (called the forward blocking gate) of the first storage site S1 of the serial input registers 210 is a control site CS. The control site may contain a partially implanted region 27 or a thick oxide layer 28 and has its electrode attached to the driver for phase B.

FIGS. 2C–2G are graphs representing potential levels and charge packets within the substrate during operation of the CCD by the clocked source method. The highest level is equivalent to ground, the lower levels are approximately −12 volts, and the barrier (middle) levels are approximately 3 volts in magnitude. A negative level corresponds to an on-state, i.e. a state where a cell may receive and/or hold a charge packet. In FIG. 2C, the potential profile, line 21, is such that cell S1 is "empty" and therefore ready to receive charge, i.e. it is at a low potential level. Cell S2 contains a charge packet, and the control site CS has been precharged with a predetermined amount of charge. The clocked source and control site voltage are both on (which corresponds to an instantaneous state). As shown in FIG. 2D, the predetermined charge packet is injected into cell S1 when phase B turns off (goes high). (Simultaneously as phase B turns off, the charge packet in cell S2 is transferred to cell S3.) Cell S1 then contains a precise amount of charge and the device is ready to prepare a new charge packet. In FIG. 2E, phase B has changed from a high to a low level and phase AIS will begin to turn off. As it does, as shown in FIG. 2F, the forward blocking gate 20 continues to prvent charge from flowing from site S1 into the control site CS, and the charge packet transfers to cell S2. The clocked source AIS is simultaneously providing charge to the control site CS. Input region 26 must be lower than the forward blocking gate 20 or charge from the clocked source would spill into cell S1 as an area of lower potential. This would distort the amount of charge previously injected into cell S1 has a highly controlled charge packet. A precise level for the clocked source is not critical during this step, as long as it is above the barrier level between the clocked source input region and the control sites, but lower than the forward blocking gate 20 of S1 as shown by potential profile line 24. In FIG. 2G, the control site CS is held on, and the clocked source is turning off (high). The excess of charge delivered to control site CS flows out (back into the input region). Since the barrier under S1 is clamped higher than the barrier under control site CS by the clocked source voltage, charge flows into CS (and in turn into S1) in a highly regulated fashion. This forms the basis for an automatic self-blocking feature of this invention. As shown in FIG. 2C, after the excess of charge flows out over the barrier of site CS, only a precise charge packet is left in the control site CS, and the steps may be repeated. (The shaded region of FIGS. 2C to 2G correspond to the presence of charge.)

It should be noted that the changing of the voltage levels of the barriers and the sweeping out of charge from the cell site do not occur instantaneously. This provides time for the charge to flow out in the desired direction as the barriers are lowered. In particular, because of the high threshold in the barrier region 20 of S1, as AIS goes on (negative), the surface potential at the input 26 goes negative faster than in the barrier region 20. This solves the possible race problem of charge entering S1 which is not properly and controllably developed.

Clearly, the amount of charge injected by this method is dependent on the barrier height. The barrier height is a function of the relative heights of the staggered oxide layer 28 or threshold shift resulting from an ion implant in region 27. However, processes for fabricating CCDs are subject to high degrees of control in determining such heights, as is known in the art. Accordingly, in exchange for requirement of critical parameters during the fabrication process, the clocked source method of operation (specifically the clocked source voltage) allows for relatively non-critical operation of the circuit. Further, the relative voltage level must be controlled with respect to the forward blocking barrier level and the phase B level, but this is relatively easy to achieve. In addition, the relative barrier heights are constant, independent of slowly varying (space wise) process variations within a semiconductor wafer.

This method of operation is in contrast to the fixed-voltage method, where instead of a (variable) clocked source being attached to the electrode, a fixed (DC) reference voltage is attached to the electrode. For a fixed voltage to properly perform the function of charge injection, this level must be strictly controlled.

In the preferred embodiment, all transistors are MOSFET transistors. Accordingly, low signals enable the transistors and high signals turn the transistors off. In the diagrams, sizes for the transistors are given in terms of surface area of a semiconductor chip. The sizes are shown as width over length (w/l) in microns and are not in anyway meant to be restrictive as alternate geometries may be employed to the same effect.

Figure 3:
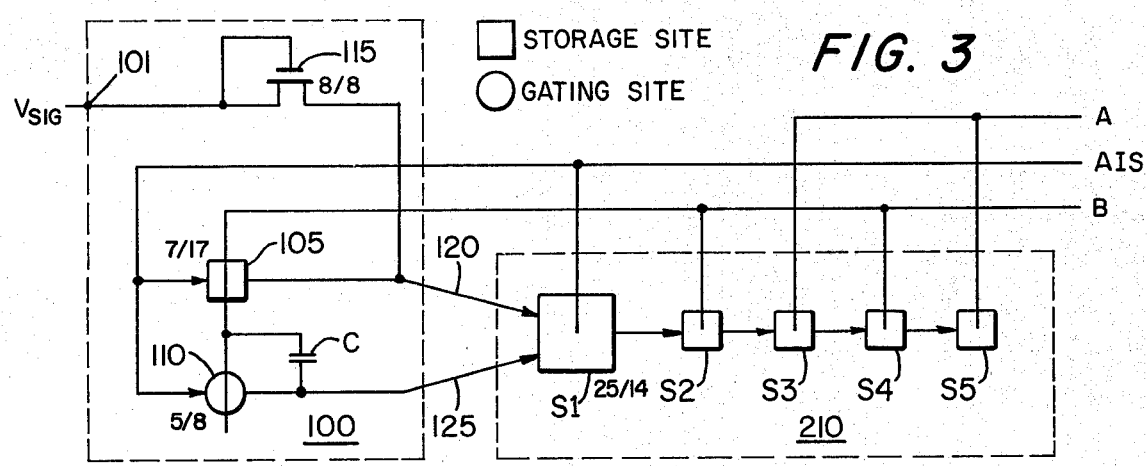
FIG. 3 is a top view of the circuit according to the invention operated by the clocked source method.

Referring now to FIG. 3, a ciruit for effecting the clocked source method according to the invention is shown. Injector circuit 100 is shown in full and input serial section 210 is shown in part. Input section 210 corresponds to the multiphase SPS register described in Related Application No. 1. Of critical importance, however, is only that S1 be gated by phase AIS. The first sotrage site of input section 210, labelled S1, must receive and hold the sum of charge received from the two parallel transfer paths which contain sites 105 and 110 respectively of injector 100. Both sites 105 and 110 have their electrodes coupled to phase driver B. Site 105 is a unidirectional storage site; site 110 is a gating (fully implanted) site. The amount of charge which is held in a storage site is also dependent on the size (geometry) of the site. Site 105 must hold charge corresponding to the signal charge, about 170 to 180 $\times$ $10^{-15}$ Coulombs. Accordingly, it has a storage area of approximately 7 microns $\times$ 10 microns (and a barrier area of approximately 7 microns $\times$ 8 microns for a total size of 7 $\times$ 17). (It is noted that the cells comprising the CCD register are preferably about ¼ mil square. Accordingly, the control site for the signal charge is significantly smaller than the cells within the register. The control site is filled to capacity whereas the register cells are not (to about 75% capacity when representing a 1, to some lesser amount when representing a 0.)

A "fat zero" (about 50 Femto Coulombs) is required for good operation of the CCD register system. S1 is sometimes referred to as a "Mixor" and, in the preferred operation of the circuit, will always has a "fat zero" injected into it. Additional (signal) charge is conditionally injected depending on the level of the Vsig signal provided through transistor 115. The capacitor C in actuality, corresponds to the inherent capacitance between the edge of the electrode (which is about 6 microns long) for site 110 and the P++ diffusion line connecting the site to site S1. This capacitance stores a "fat zero" charge packet. Accordingly, gating site 110 acts equivalently to a very small storage site (about 12 microns square in area) and, in fact, may be replaced by such a storage site without departing from the present invention. Of essence is the function of the parallel paths 120, 125 into the Mixor S1. The path 125 through site 110 is to provide a "fat zero" to the Mixor in every cycle of operation. The path 120 through site 105 is to conditionally provide a signal charge packet (of about 170 to 180 Femto Coulombs) to the Mixor. This larger, conditional charge packet corresponds to the difference between the initial representation for a logical 1 and a logical 0. (It is noted that it must follow that a logical 0 corresponds to a charge packet equal to a "fat zero".) When Vsig is high (corresponding to a logical 1), diode-coupled transistor 115 is off and charge from site 105 flows into the Mixor via path 120. When Vsig is low (corresponding to a logical 0), diode-coupled transistor 115 is enabled and the charge packet from site 105 flows through transistor 115, instead of into Mixor S1. In this manner, the "fat zero" is injected into the Mixor S1, but the signal charge from site 105 is conditionally injected depending on the level of Vsig.

Figure 4:
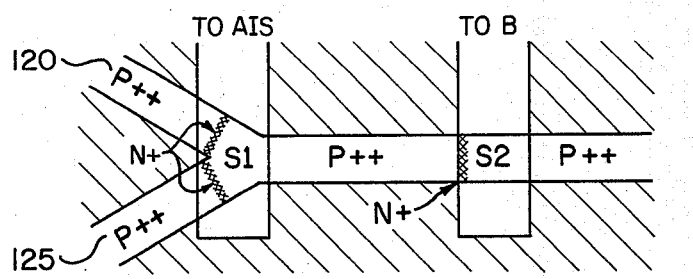
FIG. 4 is a top view of a preferred embodiment of the first cell site of a CCD register of FIGS. 1 and 3.

Referring now to FIG. 4, a top view of the Mixor site S1 is shown. The slashed area represents the presence of a very thick oxide layer (about 10,000 A) on the surface of this substrate. P++ diffusion lines connect S1 to S2, etc. Also shown is the junction of the P++ diffusion lines 120 from site 105 and line 125 from site 110. All of the P++ diffusion lines shown are coupled to the forward regions of the sites, corresponding to N+ ion implantation region (shown in cross-hatchings). Overlaying sites S1 and S2 are the corresponding electrodes shown connected to phase drivers AIS and B respectively. It is emphasized that the thick oxide between diffusion lines 120 and 125 and N+ barriers acts to insulate these lines from outside influences and from each other. In this manner, charge supplied to Mixor S1 by either line will not be able to leave the Mixor via the other line in an uncontrolled fashion.

Figure 5:
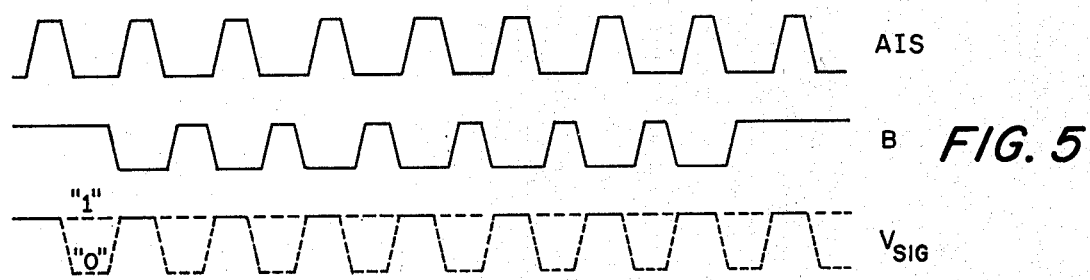
FIG. 5 is a timing diagram showing the relationship between clock pulses used to drive the circuit shown in FIG. 3.

Referring now to FIG. 5, the timing relationships between phases is shown. In the preferred embodiment, the clocked source AIS is tied to VSS which has a relatively high amplitude (12V). In this manner, the forward blocking gates 20 always forms a barrier of sufficient height to prevent undesired flow of charge in a reverse direction over this barrier. However, except for this level, phase AIS is otherwise the same as phase A.

Figure 6:
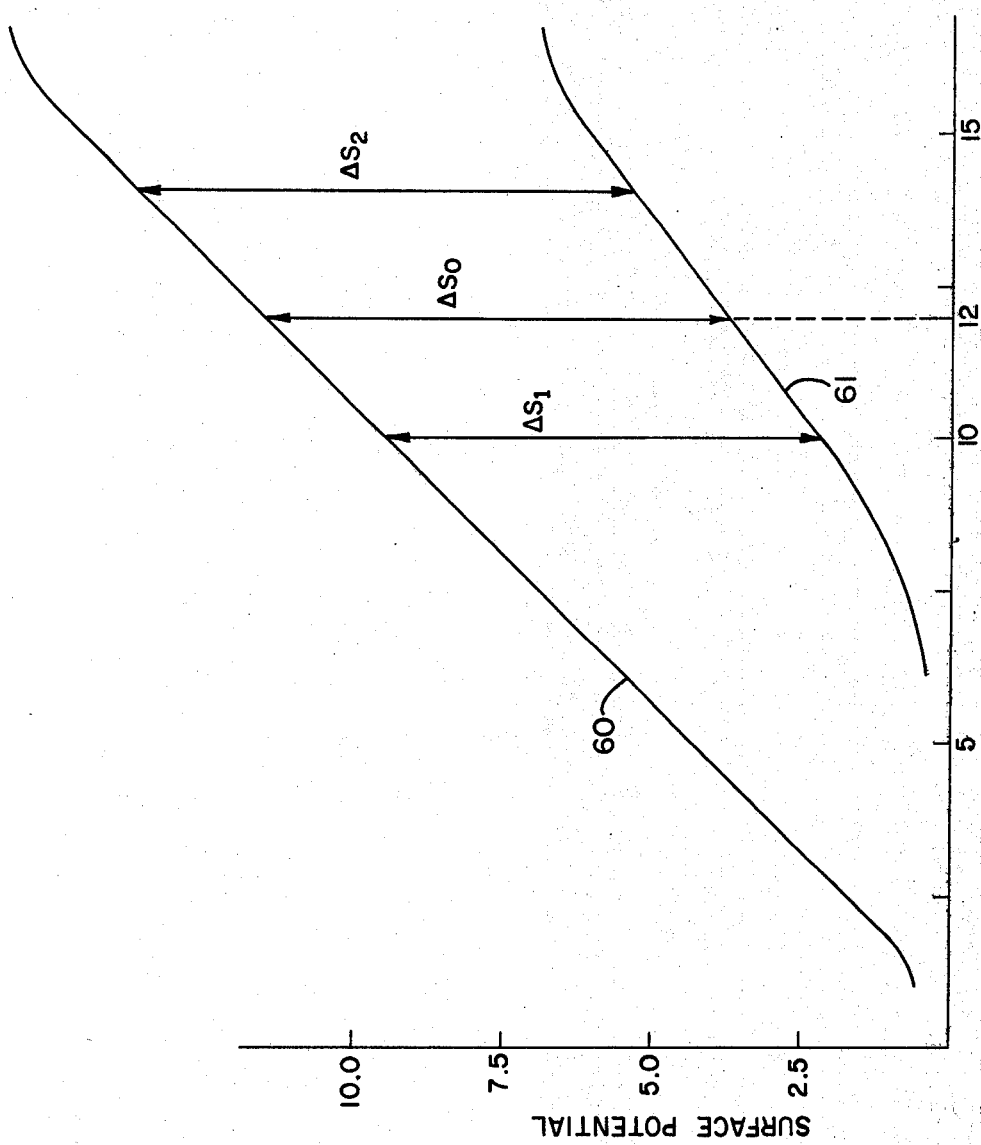
FIG. 6 is a graph showing sensitivity characteristics of the barrier height of the cell shown in FIG. 4.

Referring now to FIG. 6, sensitivity characteristics of the barrier height of the forward blocking gate are shown. It is noted that all voltages given are negative. The critical parameter in the operation of the injector circuit is the amount sent to site S1. As discussed above, this is a function of the barrier height, $\Delta S$ (as well as the cell size). However, as can be seen $\Delta S$ is the difference between the surface potential (line 60) in the storage region of a site and the surface potential (line 61) in the barrier region of the site. Within the region ($\pm$ 5 volts) of 12 volts (Vdd = 12V) $\Delta S$ is relatively invariant as shown by the relative equality between $\Delta S0$, $\Delta S1$, and $\Delta S2$. Accordingly, the injector circuit can tolerate significant variations in the input (clocked source and gating) signals and still produces charge packets within the required tolerances.

Figure 7:
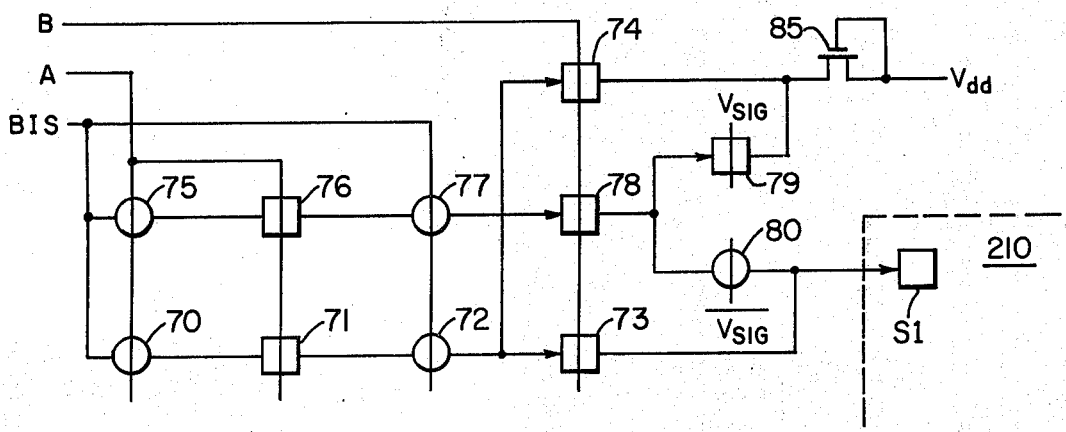
FIG. 7 is a diagram of an alternate embodiment of a charge injector circuit according to the invention.

Referring now to FIG. 7, an alternate embodiment of the present invention is shown. Cell S1 again has two parallel input paths. The upper path, through sites 75, 76, 77, 78 and 80, is for an injection of the signal charge. The lower path through sites 70, 71, 72 and 73 is for injection for a "fat zero". With respect to both paths, the first two cells, 70 and 75 are fully implanted gating sites and the next two sites 71 and 76 are non-implanted storage sites. It would be equivalent to replace each of these pair sites 75/76 and 70/71 by single unidirectional storage sites including either a staggered oxide layer or a partial ion implantation region. Accordingly, in the embodiment shown, electrodes of all these sites are commonly connected to phase A. Fully implanted gating sites 72 and 77 form forward blocking gates for storage sites 73 and 78 respectively. Accordingly, clocked source BIS is fed into control sites 71 and 76 via gating sites 70 and 75 respectively, and is also used as the gating pulse for blocking gates 72 and 77.

In the present embodiment, a "fat zero" is produced by developing a charge corresponding to twice a "fat zero" or approximately 100 Femto Coulombs in site 71. This approach may be preferable where it is too difficult or costly to develop the precise amount of charge corresponding to a single "Fat zero". Accordingly, the output path from forward blocking gate 72 is a branched path into sites 73 and 74 which effectively divides the charge originally developed in site 71. The charge which is directed to site 74 flows out through diode-coupled transistor 85 to the relatively lower voltage level $V_{dd}$. The remaining amount of charge is always transferred into cell S1 according to two-phase push clock operation.

The signal charge is transferred into cell 78 and is conditionally transferred through the branched paths. The signal charge packet is transferred either through gating site 80 into site S1 or through site 79 to the annihilator path through diode-coupled transistor 85. When $V_{sig}$ is low corresponding to a 0, the signal charge goes through the path through control site 79. When $V_{sig}$ is high ($\overline{V_{sig}}$ is low) corresponding to a 1, and the path through the implanted gating site 80 is enabled such that the charge flows into site S1.

For injection of charge into the SPS CCD register with simplified input clocking described in Related Application No. 2, the following must be noted. The injector circuits shown in both FIG. 3 and FIG. 7 provide for injection of charge into a cell site which has its electrode connected to phase A. Accordingly, instead of a charge being injected into the first cell site of the upper row of input register 210, this cell site would be eliminated and charge injected into the first site of the lower row of the register 210 which is gated by phase A. Alternatively, the timing of the injector circuit could be modified as follows: clocks A and B would be interchanged; clock AIS would be replaced by clock BIS; and Vsig would be related to clock CL1 instead of CL2. These and other modifications will be obvious to those of ordinary skill in the art and would not depart from the spirit and scope of the present invention.

It should be noted that this injector has several additional advantages. Charge development and signal amplification are performed in parallel. This means the signal $V_{sig}$ need not be valid until well into the cycle. The purpose of the signal $V_{sig}$ is to steer the stabilized charge in or out of the array. The practical effect is to remove critical time constraints on this signal line valid to window, thus reducing the requirements on the sense amplifier. The self-blocking action of the circuit, i.e. tying the closed sources AIS to the forward blocking gate, is a fundamental improvement on the general clocked source method. This eliminates the need for extra clocks usually needed in other clocked source injection schemes. Also, the Mixor element allows for easy summing of a "Fat zero" with the conditionally injected charge packet. Finally, it should be noted that the P++ diffusion lines 120, 125 may be of variable length, allowing for great flexibility of layout schemes utilizing the present invention.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. In combination with a CCD register driven by first and second clocked source signals operated in overlapping clock made with respect to each other, an integrated circuit device for injecting charge into said CCD register comprising:
   first means for receiving said first clocked source signal;
   second means coupled to said first means and responsive to said second clocked source signals, said second means for developing packets of charge; and
   third means responsive to logic level signals which represent data bits for varying the amount of charge delivered to said CCD register, said third means controllably coupling said second means to said CCD register.

2. The circuit of claim 1 wherein said third means comprises fourth means and fifth means coupling in parallel said second means to said CCD register, said fourth means responsive to said logic level signals.

3. The circuit of claim 2 wherein said fifth means is directly coupled to said CCD register.

4. The circuit of claim 2 further comprising bifurcated input means coupling said third means to said CCD register, said input means having a first branch coupled to said fourth means and a second branch coupled to said fifth means.

5. The circuit of claim 2 wherein said second means further comprises:
   sixth and seventh means each for developing one of said packets of charge, said sixth means coupled by said fourth means to said CCD register, said seventh means coupled by said fifth means to said CCD register.

6. The circuit of claim 5 wherein said fourth means includes a transistor enabled by said logic level signals for coupling said sixth means to a sink whereby the charge packet developed in said sixth means is delivered to said sink instead of to said CCD register.

7. The circuit of claim 6 wherein said transistor is diode-coupled.

8. The circuit of claim 5 wherein said sixth means includes a storage site.

9. The circuit of claim 8 wherein said storage site is capable of storing a signal charge packet of approximately $170 \times 10^{-15}$ Coulombs.

10. The circuit of claim 5 wherein said seventh means includes a storage site.

11. The circuit of claim 10 wherein said storage site is capable of storing a charge packet of approximately $50 \times 10^{-15}$ Coulombs.

12. The circuit of claim 5 wherein said seventh means includes a gating site.

13. The circuit of claim 12 wherein said seventh means includes a gating site.

14. In combination with a CCD register driven by first and second clock signals, which are operated in overlapping clock made with respect to each other, an injector circuit comprising:
   input means for said first clock signals;
   source means coupled to said input means and enabled by said second clock signals for generating packets of charge; and
   output means coupling said source means to said CCD register and responsive to input signal for varying the amount of charge injected into said CCD register.

15. The injector circuit of claim 14 wherein said injector circuit and said CCD register are integrated on the same semiconductor substrate.

16. The circuit of claim 14 further comprising gating means coupling said output means to said CCD register and responsive to said first clock signals, said gating means forming a barrier to prevent leakage of charge into or out of said CCD register.

17. The circuit of claim 16 wherein said gating means comprises a fully ion implanted CCD cell.

18. The circuit of claim 14 wherein said source means further comprises first and second means for developing charge packets.

19. The injector circuit of claim 18 wherein said output mans further comprises third means and fourth means coupling in parallel said first and said second means respectively to said CCD register.

20. The injector circuit of claim 19 wherein said first and said second means each includes a storage site.

21. The injector circuit of claim 19 wherein said first means includes a storage site and said second means includes a gating site.

22. The injector circuit of claim 20 wherein said third means includes a transistor responsive to said input signals for coupling said first means to a sink, wherein the charge packet in said first means is conditionally transferred to said CCD register or to said sink depending on the said input signal.

* * * * *